United States Patent
Zhou et al.

(10) Patent No.: US 7,451,806 B2
(45) Date of Patent: Nov. 18, 2008

(54) HEAT DISSIPATION DEVICE WITH HEAT PIPES

(75) Inventors: Shi-Wen Zhou, Shenzhen (CN); Peng Liu, Shenzhen (CN); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 191 days.

(21) Appl. No.: 11/309,305

(22) Filed: Jul. 24, 2006

(65) Prior Publication Data

US 2008/0017351 A1    Jan. 24, 2008

(51) Int. Cl.
*H05K 7/20* (2006.01)
(52) U.S. Cl. .................................. 165/104.33; 361/700
(58) Field of Classification Search ............ 165/104.33; 361/700; 257/714
See application file for complete search history.

(56) References Cited

U.S. PATENT DOCUMENTS

| | | | |
|---|---|---|---|
| 6,321,452 B1 | 11/2001 | Lin | |
| 6,542,364 B2 | 4/2003 | Lai et al. | |
| 6,625,021 B1 | 9/2003 | Lofland et al. | |
| 7,254,019 B2 * | 8/2007 | Leu et al. ................ | 165/104.33 |
| 7,278,470 B2 * | 10/2007 | Xia et al. ................ | 165/104.33 |
| 7,343,962 B2 * | 3/2008 | Xia et al. ..................... | 165/80.3 |
| 2007/0000646 A1 * | 1/2007 | Chen et al. ............. | 165/104.33 |
| 2007/0074857 A1 * | 4/2007 | Xia et al. ................ | 165/104.33 |
| 2007/0215321 A1 * | 9/2007 | Yang et al. ............. | 165/104.33 |

\* cited by examiner

*Primary Examiner*—Leonard R Leo
(74) *Attorney, Agent, or Firm*—Frank R. Niranjan

(57) ABSTRACT

A heat dissipation device is for contacting with a heat generating electronic device to remove heat from the electronic device. The heat dissipation device includes a base for thermally engaging with the electronic device and a plurality of fins arranged on a face of the base. A first heat pipe is located between the base and the fins, and is sinuously positioned on the face of the base. The first heat pipe has a first section located at a central portion of the base and a plurality of second sections located at lateral portions of the base. At least a second heat pipe has a first section thermally positioned to the base, and a second section extending remotely from the base and thermally engaging with the fins.

16 Claims, 6 Drawing Sheets

HEAT DISSIPATION DEVICE WITH HEAT PIPES

FIELD OF THE INVENTION

The present invention relates to heat dissipation devices for use in removing heat from electronic devices, and more particularly to a heat dissipation device incorporating heat pipes for improving heat dissipation efficiency of the heat dissipation device.

DESCRIPTION OF RELATED ART

During operation of an electronic device such as a computer central processing unit (CPU), a large amount of heat is often produced. The heat must be quickly removed from the CPU to prevent it from becoming unstable or being damaged. Typically, a heat dissipation device is attached to an outer surface of the CPU to absorb heat from the CPU. The heat absorbed by the heat dissipation device is then dissipated to ambient air.

Conventionally, a heat dissipation device comprises a solid metal base attached on the CPU, and a plurality of fins arranged on the base. The base is intimately attached to the CPU thereby absorbing the heat generated by the CPU. Most of the heat accumulated at the base is transferred firstly to the fins and then dissipates away from the fins. However, as electronics technology continues to advance, increasing amounts of heat are being generated by powerful state-of-the-art CPUs. As a result, many conventional heat dissipation devices are no longer able to efficiently remove heat from these CPUs.

In order to overcome the above set out problems, one type of heat dissipation device used with the electronic devices includes a heat pipe for transferring heat from one part to another part of the heat dissipation device. A heat pipe is a vacuum-sealed pipe that is filled with a phase changeable fluid, usually being a liquid, such as water, alcohol, acetone or the like, and has an inner wall thereof covered with a capillary configuration. As the electronic device heats up, a hot section usually called evaporating section of the heat pipe which is located close to the electronic device also heats up. The liquid in the evaporating section of the heat pipe evaporates and the resultant vapor reaches a cool section usually called condensing section of the heat pipe and condenses therein. Then the condensed liquid flows to the evaporating section along the capillary configuration of the heat pipe. This evaporating/condensing cycle repeats and since the heat pipe transfers heat so efficiently, the evaporating section is kept at or near the same temperature as the condensing section of the heat pipe. Correspondingly, heat-transfer capability of the heat dissipation device including such the heat pipe is improved greatly.

For instance, FIG. 6 illustrates a heat dissipation device incorporating two heat pipes 2. The heat dissipation device further comprises a base 1 for contacting with an electronic device and a plurality of fins 3 arranged on the base 1. The base 1 defines two parallel grooves 11 therein. The fins 3 cooperatively define two through holes (not labeled) therein. Each heat pipe 2 has a substantially straight evaporating section 21 received in one of the grooves 11 of the base 1, a straight condensing section 22 substantially parallel to the evaporating section 21 received in one of the through holes of the fins 3, and a connecting section 23 connecting the evaporating section 21 and the condensing section 22. The heat generated by the electronic device is absorbed by the base 1, and transferred from the base 1 to a lower portion of the fins 3 and the evaporating sections 21 of the heat pipes 2. Then the heat is transferred to an upper portion of the fins 3 by the fins 3 themselves and the heat pipes 2, and finally dissipated from the fins 3 to ambient air. However, the heat generated by the electronic device generally accumulates in central areas of the base 1, and heat transferred by the evaporating section 21 of the heat pipe 2 is limited. Consequently, large amount of the heat is still accumulated in the center of the base 1. Therefore, the heat dissipation efficiency of the heat dissipation device is not optimal and can not meet with the high heat dissipation demands on the electronic device.

What is needed, therefore, is a heat dissipation device which can achieve a greater heat-transfer capability and a greater heat dissipation capability.

SUMMARY OF THE INVENTION

A heat dissipation device in accordance with a preferred embodiment of the present invention is for contacting with a heat generating electronic device to remove heat from the electronic device. The heat dissipation device comprises a base for thermally engaging with the electronic device and a plurality of fins arranged on a face of the base. A first heat pipe is located between the base and the fins, and is sinuously positioned on the face of the base. The first heat pipe has a first section located at a central portion of the base and a plurality of second sections located at lateral portions of the base. At least a second heat pipe has a first section thermally connected to the base, and a second section extending remotely from the base and thermally engaging with the fins.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
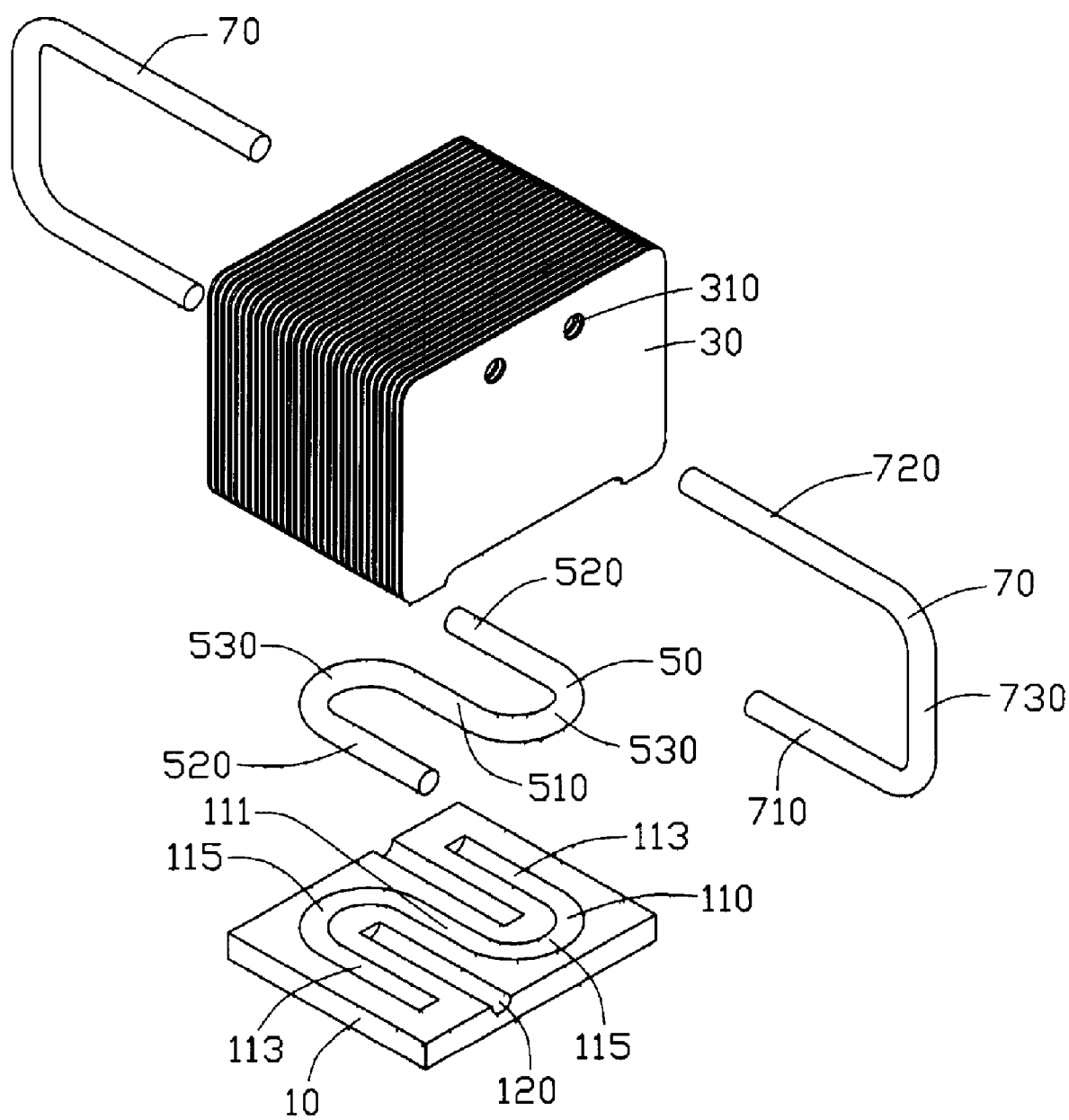
FIG. 1 is an exploded, isometric view of a heat dissipation device in accordance with a preferred embodiment of the present invention.

Referring to FIG. 1, a heat dissipation device in accordance with a preferred embodiment of the invention comprises a base 20, a plurality of fins 30 arranged on the base 10, a first heat pipe 50 arranged on the base 10, and two second heat pipes 70 thermally contacting the base 10 and the fins 30.

The base 10 is a substantially rectangular metal plate having good heat conductivity, and has a bottom face (not labeled) for contacting with an electronic device (not shown) and a top face (not labeled) opposing the bottom face. A substantially S-shaped first groove 110 is defined in the top face of the base 10 for receiving the first heat pipe 50 therein.

The first groove 110 comprises a first portion 111 spanning a center of the base 10, two second portions 113 located adjacent to two opposite lateral sides of the base 10, and two arched third portions 115 located adjacent to another two opposite lateral sides of the base 10 and connecting corresponding second portions 113 and the first portion 111. Therefore, two substantially U-shaped regions (not labeled) are defined by corresponding second sections 113, third portions 115 and the first portion 111 on the top face of the base 10. In each U-shaped region, a second groove 120 is defined between the corresponding second portion 113 and the first portion 111 of the first groove 110. The second grooves 120 are substantially parallel to the first portion 111 and the second portions 113 of the first groove 110.

Each of the fins 30 is substantially rectangular and is made from a metal sheet. Each fin 30 has a body thereof defining two spaced through holes (not labeled) in an upper portion thereof, the holes of the fins 30 cooperate to define two through channels 310 for receiving the second heat pipes 70 therein.

The first heat pipe 50 is similar in shape to the first groove 110 of the base 10. The first heat pipe 50 comprises a first section 510, two substantially parallel second sections 520, and two arc-shaped third sections 530 extending from opposite ends of the first section 510 and connecting corresponding second sections 520 and the first section 510.

Figure 2:
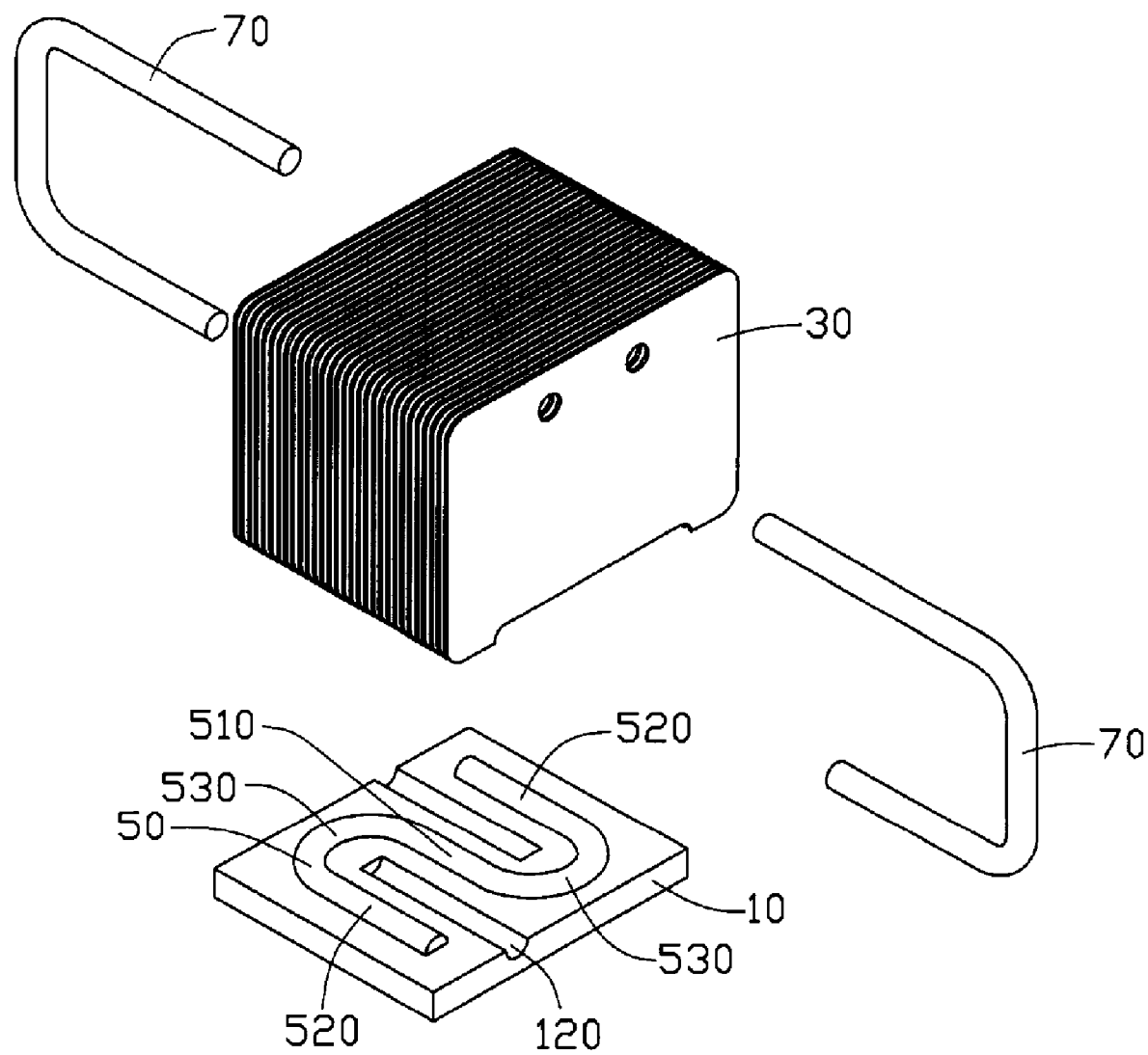
FIG. 2 is a partially assembled view of FIG. 1.

Referring to FIG. 2, the first heat pipe 50 is accommodated in the first groove 110 of the base 10, with the first, second, third sections 510, 520, 530 thereof being received in corresponding first, second, third portions 111, 113, 115 of the first groove 110. As a result the first section 510 is located at the central portion of the base 10, the two second sections 520 and two third sections 530 are located corresponding lateral portions of the base 10.

Each of the second heat pipes 70 is substantially U-shaped, and comprises a first section 710, a second section 720 parallel to the first section 710, and a connecting section 730 substantially perpendicularly extending from the first section 710 and connecting the first and second sections 710, 720 together. The second section 720 is longer than the first section 710. A rounded corner is formed at each of joints of the sections 710, 720, 730 of the second heat pipe 70.

Figure 3:
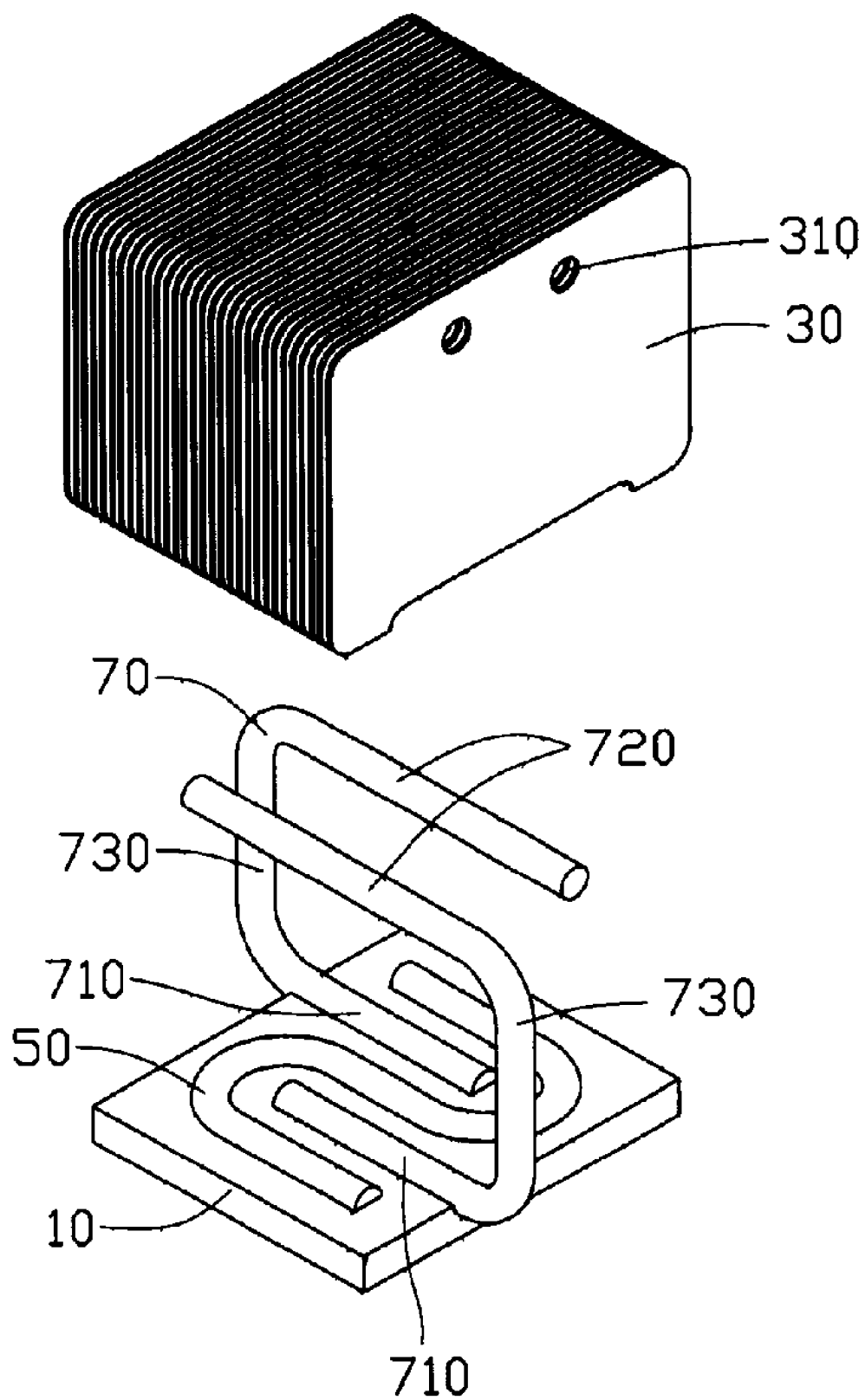
FIG. 3 is a further partially assembled view of FIG. 2.
Figure 4:
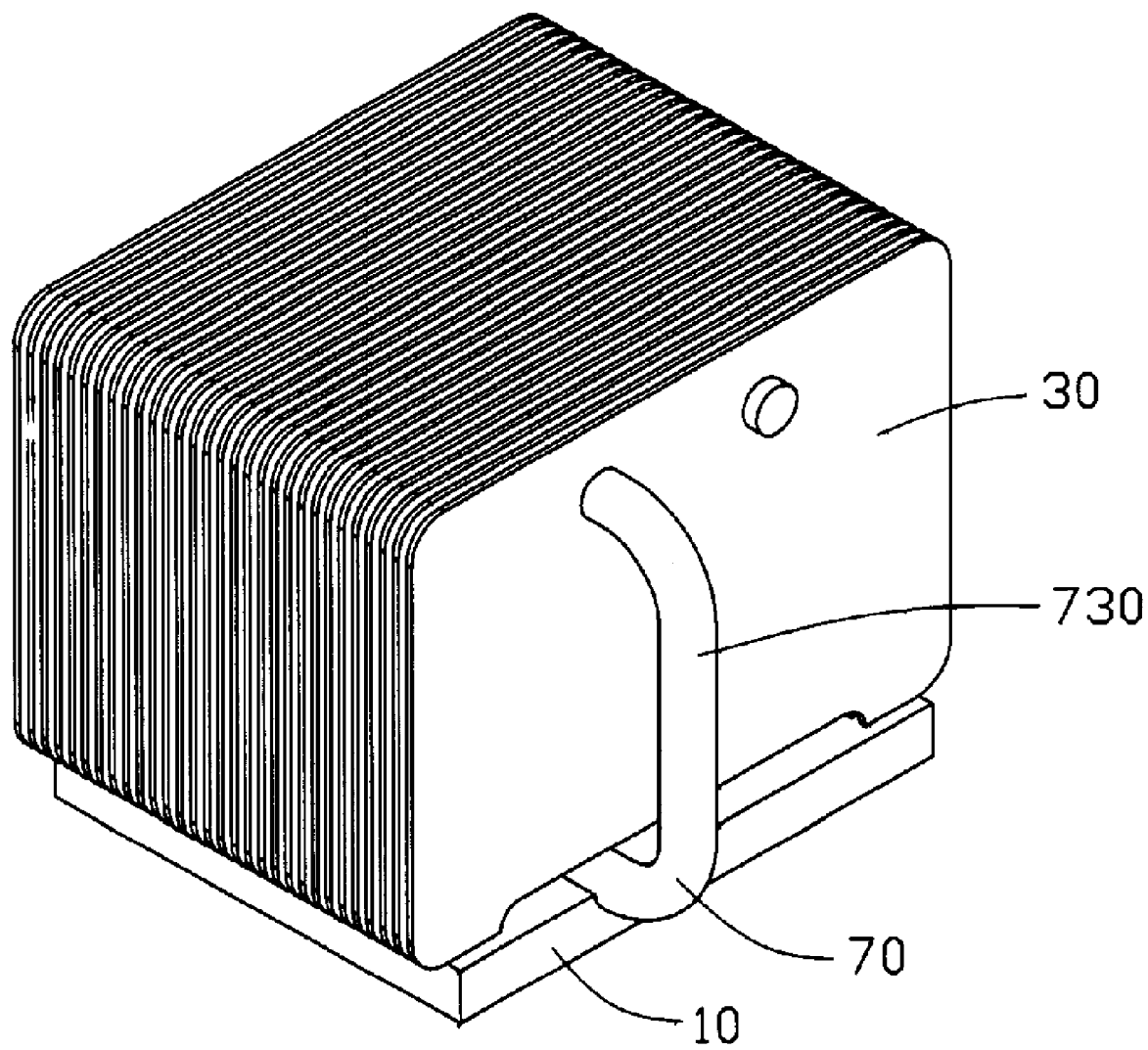
FIG. 4 is an assembled view of FIG. 3.
Figure 5:
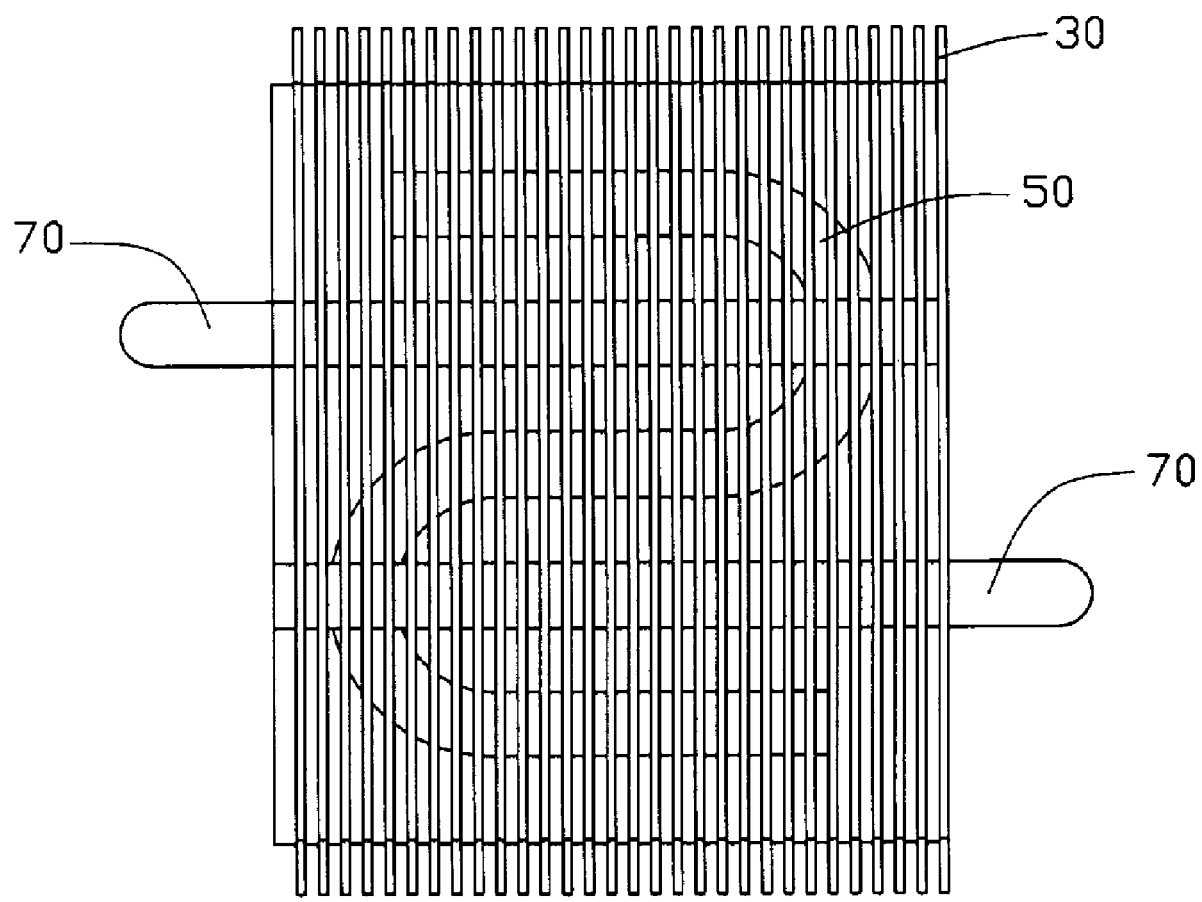
FIG. 5 is a top plan view of FIG. 4.
Figure 6:
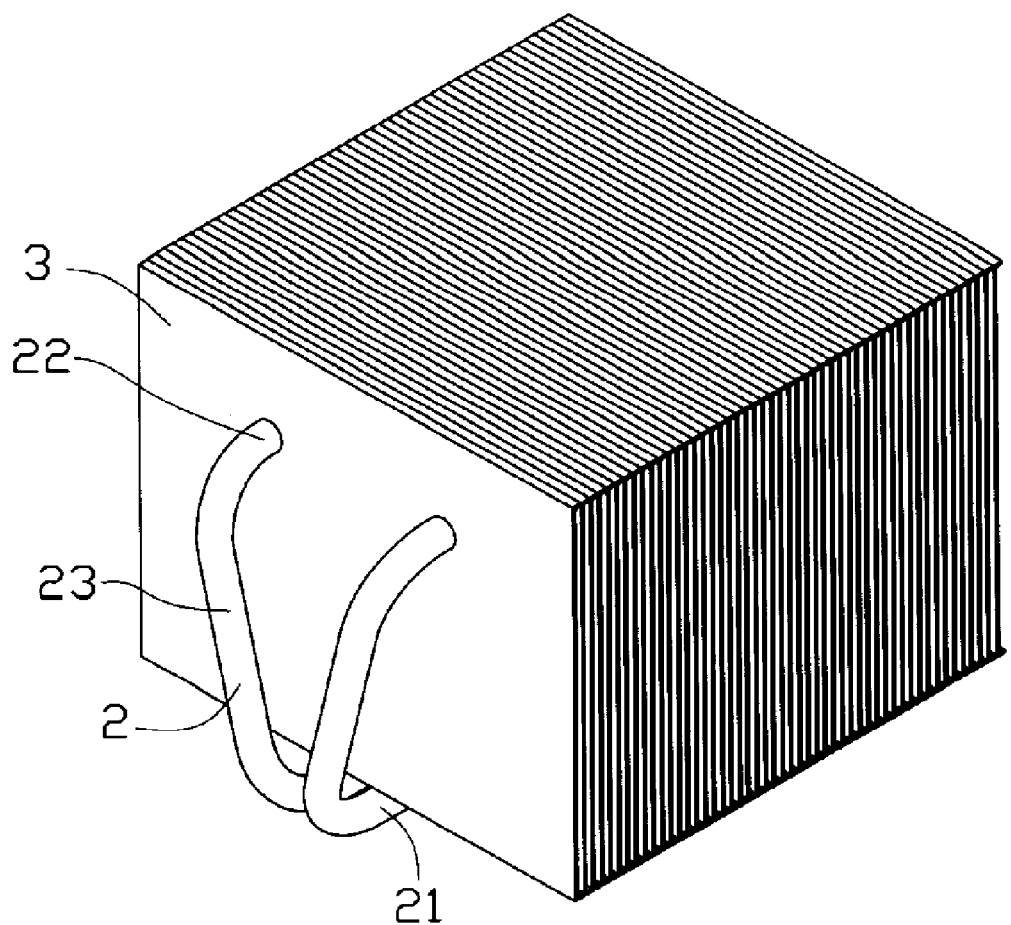
FIG. 6 is a partially exploded, isometric view of a heat dissipation device in accordance with related art.
Figure 6:
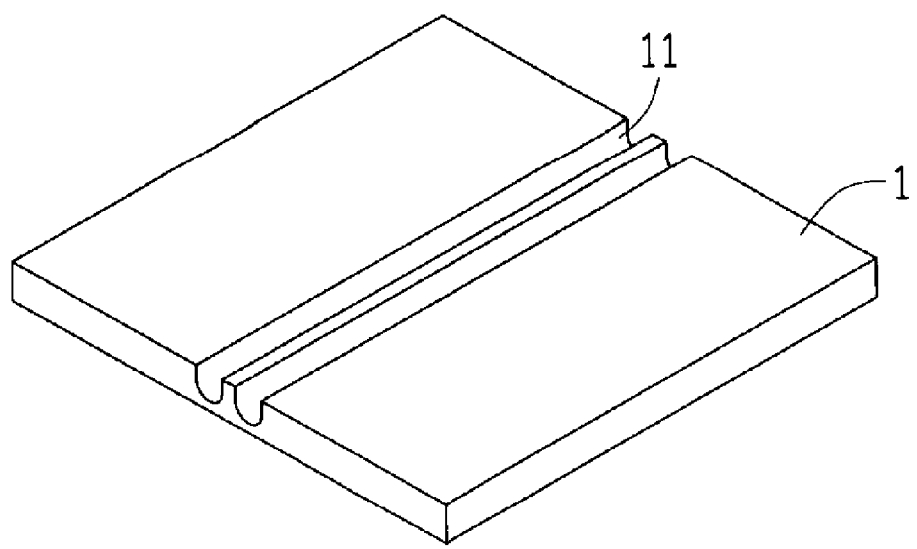

Referring to FIGS. 3-5, the second heat pipes 70 thermally contact the base 10 and the fins 30. The first sections 710 of the second heat pipes 70 are thermally accommodated in corresponding second grooves 120 of the base 10. The first sections 710 of the second heat pipes 70 are positioned between the corresponding second sections 520 and the first section 510 of the first heat pipe 50. The second sections 720 extend from the base 10 and through corresponding channels 310 of the fins 30 from two opposite sides of the fins 30. The connecting sections 730 are located at extreme sides of the fins 30. A bottom of the fins 30 forms two ends contacting the base 10 at two opposite sides of the base 10.

In use of the heat dissipation device in accordance with this embodiment of the invention, the base 10 absorbs heat from the electronic device to which the base 10 is attached. The first heat pipe 50 absorbs the heat in the base 10 and spreads the heat to the lateral portions of the base 10 via the third sections 530 and the second sections 520 further transferring heat from the first section 510. Some of the heat in the base 10 is absorbed by the first sections 710 of the second heat pipes 70 and is transferred to the fins 30 via the connecting sections 730 and the second sections 720 of the second heat pipes 70. Some of the heat in the base 10 is transferred directly to the fins 30. The heat in the fins 30 is subsequently dissipated to ambient air.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for contacting with a heat generating electronic device to remove heat from the heat generating electronic device, the heat dissipation device comprising:
   a base for thermally engaging with the electronic device, having a face;
   a plurality of fins arranged on the face of the base; and
   a first heat pipe located between the base and the fins, and sinuously positioned on the face of the base, the first heat pipe having a first section located at a central portion of the base, and a plurality of second sections located at lateral portions of the base;
   a second heat pipe having a first section thermally positioned to the base, and a second section extending remotely from the base and thermally engaging with the fins;
   wherein the first heat pipe comprises two second sections located at two opposite lateral portions of the base.

2. The heat dissipation device of claim 1, wherein the first heat pipe comprises two arc-shaped third sections extending from two ends of the first section and connecting corresponding second sections and the first section of the first heat pipe.

3. The heat dissipation device of claim 2, wherein the two third sections of the first heat pipe are located at two opposite lateral portions of the base.

4. The heat dissipation device of claim 3, wherein the first heat pipe is substantially S-shaped.

5. The heat dissipation device of claim 2, wherein the first section of the second heat pipe is located between the first section and one of the second sections of the first heat pipe.

6. The heat dissipation device of claim 5 further comprises a third heat pipe having a first section located between the first section and another of the second sections of the first heat pipe, and a second section extending remotely from the base and thermally engaging with the fins.

7. The heat dissipation device of claim 6, wherein the second and third heat pipes respectively comprise connecting sections positioned at two opposite sides of the fins and connecting with corresponding first sections and second sections of the second and third heat pipes.

8. The heat dissipation device of claim 1, wherein the fins define a channel receiving the second section of the second heat pipe.

9. A heat dissipation device comprising:
   a base having a bottom face for thermally engaging with a heat generating electronic device and a top face;
   a first heat pipe sinuously engaging with the base and having a plurality of sections thereof spreading on a central and lateral portions of the base;
   two second heat pipes each having a first section thermally engaging with the base and a second section extending remotely from the base; and
   a plurality of fins thermally engaging with the second sections of the two second heat pipes;
   wherein the first heat pipe comprises a first section located at the central portion of the base, two second sections located at two opposite lateral portions of the base, two third sections located at another two opposite lateral portions of the base and connecting corresponding second sections and the first section of the first heat pipe.

10. The heat dissipation device of claim 9 wherein the two second sections and the fist section of the first heat pipe are substantially parallel to each other.

11. The heat dissipation device of claim 10, wherein the third sections of the first heat pipe each have a substantially arc-shaped configuration.

12. The heat dissipation device of claim 10, wherein the first sections of the two second heat pipes are positioned between corresponding second sections and the first section of the first heat pipe.

13. The heat dissipation device of claim 12, wherein the two second heat pipes each comprise a connecting section connecting the first and second sections thereof, the connecting sections of the two second heat pipes being located at two opposite sides of the fins.

14. The heat dissipation device of claim 9, wherein the base defines a plurality of grooves receiving the first heat pipes and the first sections of the two second heat pipes therein.

15. A heat dissipation device comprising:

a base for thermally connecting with a heat-generating electronic component;

a serpentine first heat pipe horizontally embedded in a face of the base;

a plurality of fins mounted on the base and thermally connecting therewith; and a second heat pipe having a first portion thermally connecting with the base and a second portion extending through the fins and thermally connecting therewith;

wherein the first heat pipe comprises two end portions located at two opposite lateral portions of the base.

16. The heat dissipation device of claim 15, wherein the first heat pipe has a middle portion substantially aligned with a middle portion of the base.

* * * * *